US008525274B2

(12) United States Patent
Takada

(10) Patent No.: US 8,525,274 B2
(45) Date of Patent: Sep. 3, 2013

(54) SEMICONDUCTOR DEVICE AND METHOD OF MANUFACTURING THE SAME

(75) Inventor: Yoshiharu Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 159 days.

(21) Appl. No.: 13/050,539

(22) Filed: Mar. 17, 2011

(65) Prior Publication Data

US 2012/0043591 A1 Feb. 23, 2012

(30) Foreign Application Priority Data

Aug. 19, 2010 (JP) ................................ P2010-184439

(51) Int. Cl.
*H01L 29/78* (2006.01)

(52) U.S. Cl.
USPC .... 257/410; 257/411; 257/640; 257/E29.132; 257/E21.625; 438/287; 438/785

(58) Field of Classification Search
USPC .......... 257/410, 411, 640, E29.132, E21.625; 438/287, 785, FOR. 196
See application file for complete search history.

(56) References Cited

U.S. PATENT DOCUMENTS

| | | | | |
|---|---|---|---|---|
| 3,853,496 A | * | 12/1974 | Kim | 438/287 |
| 6,146,927 A | * | 11/2000 | Yamanaka | 438/149 |
| 6,635,576 B1 | * | 10/2003 | Liu et al. | 438/700 |
| 7,935,620 B2 | * | 5/2011 | Green et al. | 438/570 |
| 8,039,301 B2 | * | 10/2011 | Kub et al. | 438/105 |
| 8,049,252 B2 | * | 11/2011 | Smith et al. | 257/194 |
| 2002/0119610 A1 | * | 8/2002 | Nishii et al. | 438/167 |
| 2005/0145883 A1 | * | 7/2005 | Beach et al. | 257/194 |
| 2011/0147798 A1 | * | 6/2011 | Radosavljevic et al. | 257/194 |
| 2012/0138948 A1 | * | 6/2012 | Miyajima et al. | 257/76 |

FOREIGN PATENT DOCUMENTS

| | | |
|---|---|---|
| JP | 6-333943 | 12/1994 |
| JP | 2002-164535 | 6/2002 |
| JP | 2003-86797 | 3/2003 |
| JP | 2008-147524 A | 6/2008 |
| JP | 2009-280418 | 12/2009 |
| JP | 2010-503224 | 1/2010 |
| WO | WO 2008/028940 A1 | 3/2008 |

OTHER PUBLICATIONS

Japanese Office Action issued May 25, 2012, in Patent Application No. 2010-184439 (with English-language translation).

* cited by examiner

*Primary Examiner* — George Fourson, III
(74) *Attorney, Agent, or Firm* — Oblon, Spivak, McClelland, Maier & Neustadt, L.L.P.

(57) ABSTRACT

A semiconductor device includes a substrate, a semiconductor, a first surface passivation film including nitride, a second passivation film, a gate electrode, and a source electrode and a drain electrode. The semiconductor layer is provided on the substrate. The first surface passivation film including nitride is provided on the semiconductor layer and has at least two openings. The second surface passivation film covers an upper surface and a side surface of the first surface passivation film. The gate electrode is provided on a part of the second surface passivation film. The source electrode and the drain electrode are respectively provided on the two openings. In addition, the second surface passivation film includes a material of which melting point is higher than the melting points of the gate electrode, the source electrode, and the drain electrode.

10 Claims, 11 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2010-184439, filed on Aug. 19, 2010, the entire contents of which are incorporated herein by reference.

FIELD

Embodiments basically relate to a semiconductor device and a method of manufacturing the same.

BACKGROUND

In a semiconductor device such as a field effect transistor, an isolating surface protection film, that is, a so-called surface passivation film, having through-holes is formed on a semiconductor layer, and then, electrodes are formed in the through-holes. In such a semiconductor device, the electrodes are formed at high temperatures in order to provide an excellent electrical connection between each electrode and the semiconductor layer. Here, when the surface passivation film and the electrodes are in contact with each other, the electrode material may diffuse into the surface passivation film during the preparation of the electrodes. The region of the surface passivation film into which the electrode material diffuses becomes conductive and brings about a possibility to cause a decrease in a breakdown voltage, an increase in current collapse, and variations in characteristics of each device.

BRIEF DESCRIPTION OF DRAWINGS

Aspects of this disclosure will become apparent upon reading the following detailed description and upon reference to accompanying drawings. The description and the associated drawings are provided to illustrate embodiments of the invention and not limited to the scope of the invention.

DESCRIPTION

As will be described below, according to an embodiment, a semiconductor device includes a substrate, a semiconductor, a first surface passivation film including nitride, a second passivation film, a gate electrode, and a source electrode and a drain electrode. The semiconductor layer is provided on the substrate. The first surface passivation film including nitride is provided on the semiconductor layer and has at least two openings. The second surface passivation film covers an upper surface and a side surface of the first surface passivation film. The gate electrode is provided on a part of the second surface passivation film. The source electrode and the drain electrode are respectively provided on the two openings. In addition, the second surface passivation film includes a material of which melting point is higher than the melting points of the gate electrode, the source electrode, and the drain electrode.

First Embodiment

Figure 1:
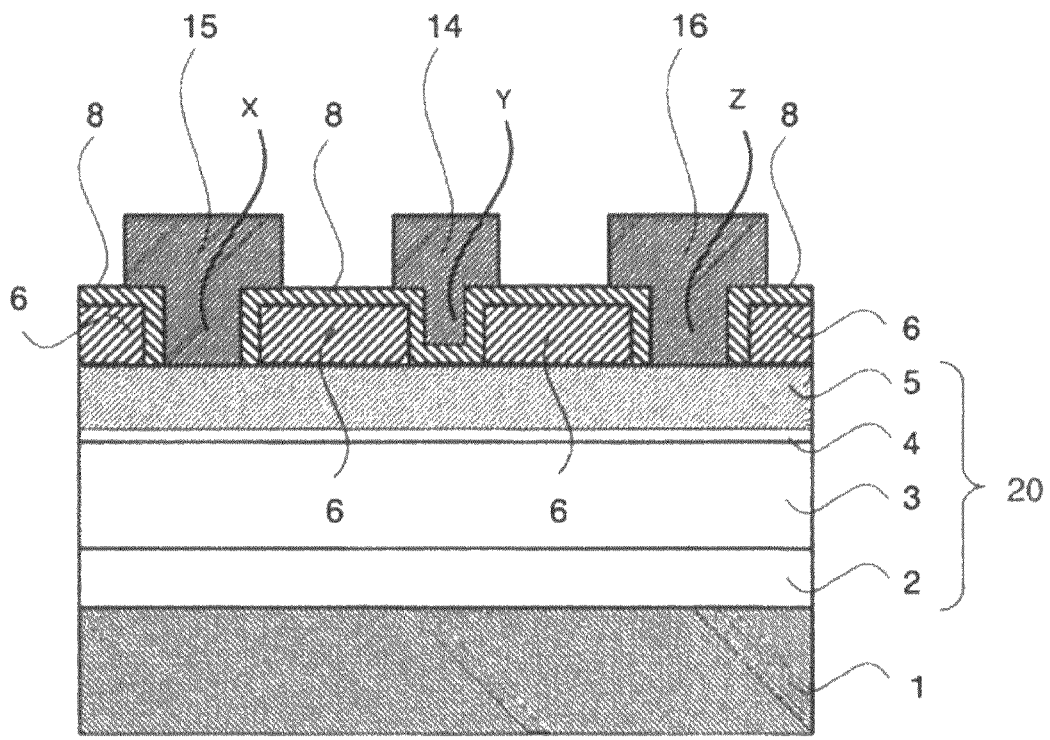
FIG. 1 is a schematic sectional view of a semiconductor device according to a first embodiment.

A semiconductor device according to a first embodiment will be explained with reference to FIG. 1. FIG. 1 is a view showing a section of a high electron mobility transistor, which is a semiconductor device having a gate insulator film. The high electron mobility transistor, i.e., a field effect transistor is provided with a substrate 1, a semiconductor layer 20 formed on the substrate 1, a first passivation film 6 formed on the semiconductor layer 20, and a second passivation film 8. The first passivation film 6 has two or more openings (i.e., a first opening, a second opening and a third opening) X, Y, Z. The second passivation film 8 covers an upper surface, a side surface, and the opening Y of the first passivation film 6. The field effect transistor is further provided with a gate electrode 14 formed on the second passivation film 8 which covers the opening Y, a source electrode 15 and a drain electrode 16 formed in the openings X, Z, respectively. The semiconductor layer 20 is formed with a buffer layer 2, a channel layer 3, a spacer layer 4 and a barrier layer 5 grown in this order from the substrate 1.

The source electrode 15 and the drain electrode 16 are partially in contact with the barrier layer 5. The second passivation layer 8 is partially sandwiched between the gate electrode 14 and the barrier layer 5.

A material is employed for the second surface passivation film 8. The melting point of the material is higher than that of the electrode material. Accordingly, the second surface passivation film 8 functions to prevent the electrode material from diffusing into the first surface passivation film 6. In addition, a portion of the second surface passivation film 8 sandwiched between the gate electrode 14 and the barrier layer 5 functions as a gate isolator film.

Conductive materials are employed for the gate electrode 14, the source electrode 15 and the drain electrode 16. The materials include aluminum, titanium, nickel, tantalum, zirconium, molybdenum, gold, silver, platinum, copper, and a monolayer film thereof and a multilayer film of two or more kinds of metal thereof. For example, the thickness thereof is to be from 100 nm to 500 nm. At least aluminum (of which melting point is about 660° C.) is employed as the source electrode 15 and the drain electrode 16 to make excellent electric contacts with the barrier layer 5. For example, a titanium layer having a thickness (of which melting point is about 1670° C.) of 5 nm to 50 nm and an aluminum layer having a thickness of 100 nm to 300 nm are preferable. Further, a bilayer film of a 25 nm-thick titanium layer and a 200 nm-thick aluminum layer formed thereon is preferable.

The second passivation film 8 employs insulating materials of which melting points are higher than those of the electrodes 14, 15, 16. It is further favorable that the material of the second passivation film 8 has a high breakdown voltage. For example, it is possible to employ metallic oxide such as aluminum oxide ($Al_2O_3$), hafnium oxide ($HfO_2$), zirconium oxide ($ZrO_2$) and tantalum oxide ($Ta_2O_5$), and a multi-layer thereof. Here, $Al_2O_3$ (of which melting point is about 2020° C.) is employed. The thickness of the second passivation film 8 is preferably to be 50 nm or less and is more preferably to be 30 nm. When the second passivation film 8 is too thick, potential of the gate electrode is hardly applied to the semiconductor layer.

The first passivation film 6 employs a material including at least nitride, capable of lowering state density of the interface between the first passivation film 6 and the barrier layer 5 and proving insulation properties between respective electrodes. For example, the first passivation film 6 may employ silicon nitride ($SiN_X$; X is a positive value), a multilayer of silicon nitride with silicone oxide ($SiO_X$) laminated thereon. The silicon nitride is formed with a CVD method to be required to have a thickness of several tens of nanometers to several hundreds of nanometers. Accordingly, the melting point thereof is in the range from 600° C. to 700° C. Here, $SiN_X$ is employed as the first passivation film 6. The thickness of the first passivation film 6 is preferably 300 nm or less and is more preferably 200 nm or less. Further, the thickness of the first passivation film 6 is much more preferably in the range from 50 nm to 100 nm.

The barrier layer 5 employs a semiconductor material having a band structure allowing two-dimensional electron gas to be formed at an interface between the barrier layer 5 and the channel layer 3. For example, the barrier layer 5 employs a structure of a monolayer or a multilayer of $Al_hGa_iN$ ($0<h\leq1$, $0\leq i<1$, $h+i=1$) or/and $In_pAl_qGa_rN$ ($0\leq p<1$, $0\leq r<1$, $0<q\leq1$, $p+q+r=1$). Here, AlGaN is employed as the barrier layer 5. For example, the ratio of Al is preferably in the range from 0.1 to 0.4 and further preferably about 0.25 to obtain a mixed crystal AlGaN. The thickness of AlGaN is preferably in the range from 10 nm to 40 nm and is more preferably 20 nm.

The spacer layer 4 distances a two-dimensional electron gas from a hetero junction interface between the barrier layer 5 and the channel layer 3 to control electron scattering, thereby allowing it to obtain high electron mobility. Here, AlN is employed as the spacer layer 4. The thickness thereof is preferably 2 nm or less and more preferably 1 nm.

The channel layer 3 employs a high-purity semiconductor material being free from impurities. For example, the channel layer 3 may employ GaN, $In_jGa_kN$ ($0<j\leq1$, $0\leq k<1$, $j+k=1$) or the like. Here, GaN is employed as the channel layer 3.

The buffer layer 2 is to grow the high-purity channel layer and employs a commercially available semiconductor layer formed of a material similar to the above channel layer 3. Here, GaN is employed as the buffer layer 2.

The substrate 1 is a substrate to grow the buffer layer 2 thereon and employs a silicon monocrystal substrate, a SiC substrate, a sapphire substrate or the like.

An electrode material is alloy to form the electrodes 15, 16, thereby allowing the electrodes 15, 16 to make excellent electrical contacts with the channel layer 3. When aluminum (Al) is employed as the electrode material, the electrode material Al is heat-treated at a temperature of 600° C. or more to form the electrodes 15, 16. The second passivation film 8 is thermally stable and has a higher melting point than the electrode material, thereby allowing it not to prevent the second passivation film 8 from being melted during the heat treatment of the electrodes 14, 15, 16. In general, a SiN film is employed as the first passivation film 6 which is formed with a plasma CVD method and capable of lowering state density of the interface between the first passivation film 6 and the barrier layer 5. However, the SiN film formed with the plasma CVD method has many defects. Accordingly, there is a possibility that the electrode material diffuses therefrom to the first passivation film 6 when the electrode material is in contact with the first passivation film 6. Here, the second passivation film 8 is provided to prevent the electrode material from diffusing into the first passivation layer 6.

The configuration of the embodiment is employed not only for a high electron mobility transistor but also a semiconductor device to be provided with a gate electrode on a semiconductor layer via an insulating film, thereby allowing it to prevent electrode materials from diffusing to the insulating film in such a semiconductor device as well as in the embodiment.

Further, a portion of a lower layer of the gate electrode 14 is provided with the barrier layer 5 via the second passivation film 8 to allow a leak current from passing between the gate electrode 14 and the barrier layer 5. This comes from the fact that the band gaps of SiN and $Al_2O_3$ are 5.1 eV and 8.9 eV, respectively, and the gate insulator film of $Al_2O_3$ having a higher dielectric constant than SiN can be thickened.

Driving a device at high voltages generates a high electric field between the gate electrode 14 and the drain electrode 16 to cause an electric field concentration at a gate electrode end on the drain side. The structure of the embodiment has many electrode ends so that the electrode is formed to be overlapped with an opening provided to the passivation film. Accordingly, the structure can relax the electric field concentration to be effective for high break-down voltages. A SiN film prepared with a plasma CVD method has a break-down voltage of 3 MV/cm while an $Al_2O_3$ film prepared with an atomic layer deposition (ALD) method has a high break-down voltage of 8 MV/cm. Therefore, employing the $Al_2O_3$ film prepared with an ALD method as the second passivation film allows it to prevent the breakdown caused by the electric field concentration.

A method of manufacturing the semiconductor device shown in FIG. 1 will be explained with reference to FIGS. 2 to 10. FIGS. 2 to 10 are sectional views showing manufacturing processes of the semiconductor device.

Figure 2:
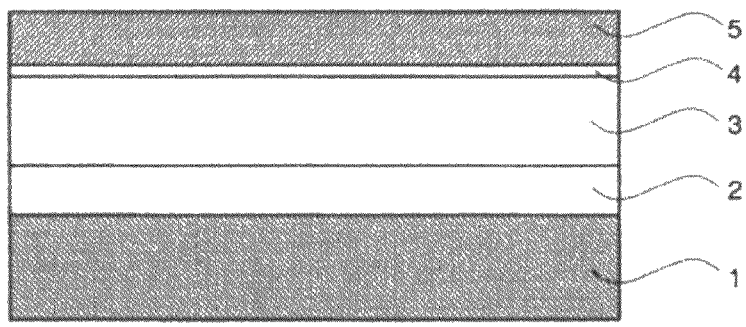
FIG. 2 is a view showing a manufacturing process of the semiconductor device according to the first embodiment.

As shown in FIG. 2, the semiconductor layer 20 including two or more semiconductor layers is formed on the Si substrate 1 with a molecular beam epitaxial (MBE) apparatus, a metalorganic chemical vapor deposition (MOCVD) apparatus or the like. That is, the semiconductor layer 20 is a heteroepitaxial layer. As a specific example, the buffer layer 2 including GaN is formed on the Si substrate 1 and the channel layer 3 including undoped GaN is formed on the buffer layer 2. Then, the spacer layer 4 including AlN is formed on the channel layer 3 and the barrier layer 5 including non-doped type $Al_xGa_{1-x}N$ (0<x<0.5) is formed on the spacer layer 4.

Figure 3:
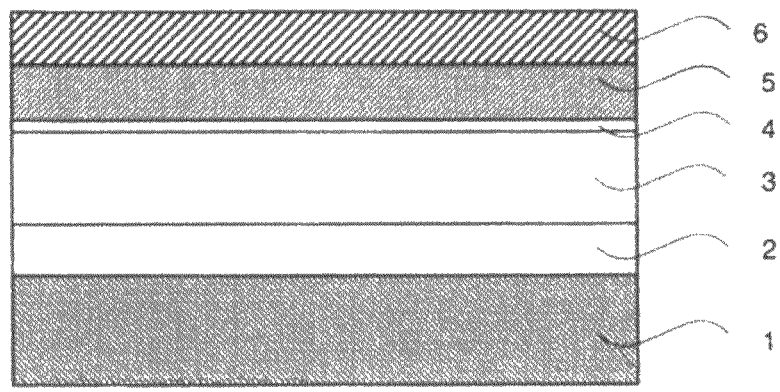
FIG. 3 is a view showing a manufacturing process of the semiconductor device according to the first embodiment.

As shown in FIG. 3, the SiN film is formed on the upper surface of the barrier layer 5 with a plasma CVD (Chemical Vapor Deposition) apparatus or the like.

Figure 4:
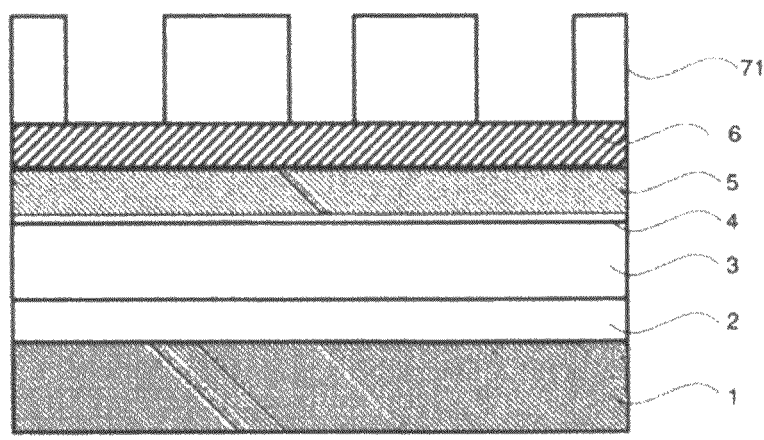
FIG. 4 is a view showing a manufacturing process of the semiconductor device according to the first embodiment.

As shown in FIG. 4, the openings are formed on the first surface passivation film 6 using a photolithography process at positions of the electrodes 14, 15, 16 to be formed later. That is, a photoresist 71 to be a mask material for the subsequent etching process is formed on the SiN film. A pattern for an arrangement of the electrodes 14, 15, 16 to be formed later is formed on the photoresist 71 to be formed with a lithography process. Portions of the SiN film on which the pattern of the photoresist 71 is not formed are removed by wet etching or dry etching to pattern the SiN film, thereby forming the first surface passivation film 6. Subsequently, the photoresist 71 is removed.

Figure 5:
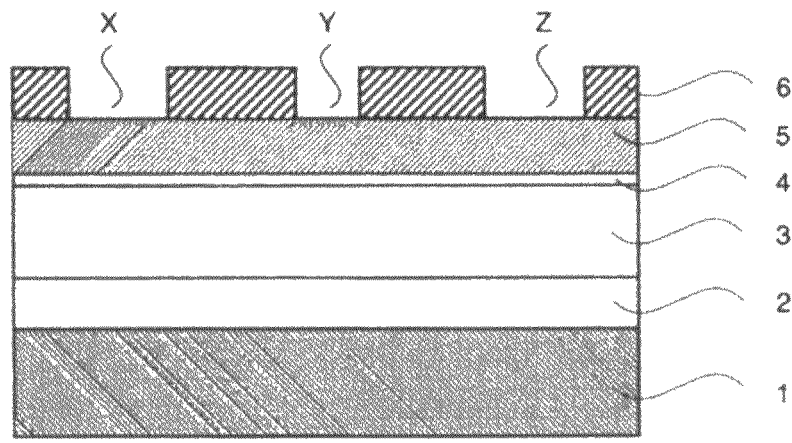
FIG. 5 is a view showing a manufacturing process of the semiconductor device according to the first embodiment.

As shown in FIG. 5, the openings X, Y, Z are formed in the first surface passivation film 6. The first passivation film 6 is arranged to align in a direction parallel to a main surface of the substrate 1. A surface of the barrier layer 5 is exposed through the portions where the three openings X, Y, Z have been formed.

Figure 6:
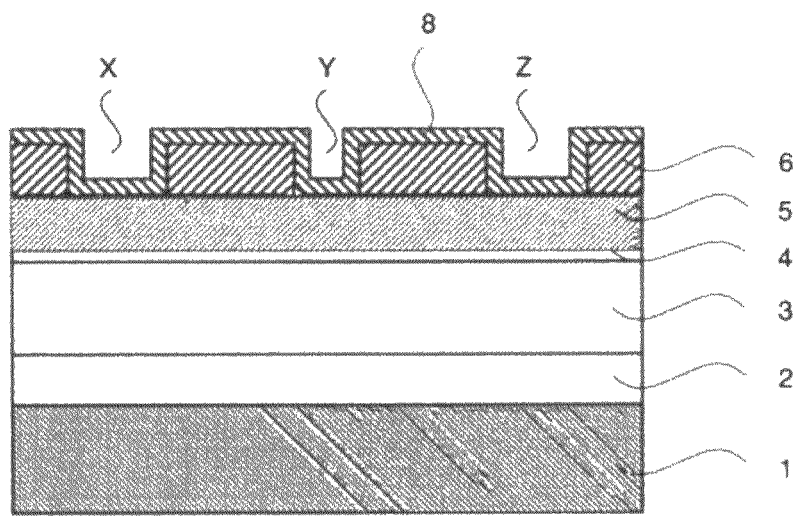
FIG. 6 is a view showing a manufacturing process of the semiconductor device according to the first embodiment.

As shown in FIG. 6, the $Al_2O_3$ film 8 is formed on the first surface passivation film 6 and on the surface of the barrier layer 5 exposed through the openings of the first surface passivation film 6. An ALD apparatus or the like is used to form the $Al_2O_3$ film 8. The $Al_2O_3$ film 8 is formed also on side surfaces of the first surface passivation film 6.

Figure 7:
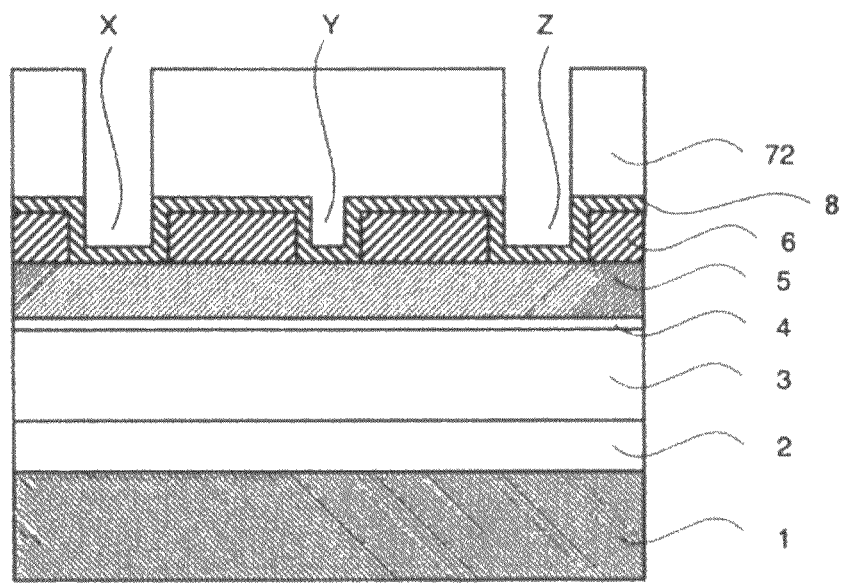
FIG. 7 is a view showing a manufacturing process of the semiconductor device according to the first embodiment.

Subsequently, as shown in FIG. 7, a photoresist 72 having openings is prepared on the $Al_2O_3$ film 8 using a lithography process. The openings are provided to the photoresist 72 to arrange the source electrode 15 and the drain electrode 16. That is, the openings are also formed in the photoresist 72 in accordance with the two openings X, Z sandwiching the central opening Y of the three openings in the first surface passivation film 6. Portions in the $Al_2O_3$ film 8 corresponding to the two openings of the photoresist 72 on the $Al_2O_3$ film 8 are removed by wet etching or dry etching. That is, the $Al_2O_3$ film 8 on the openings X, Z of the first surface passivation film 6 is removed as shown in FIG. 8.

Figure 8:
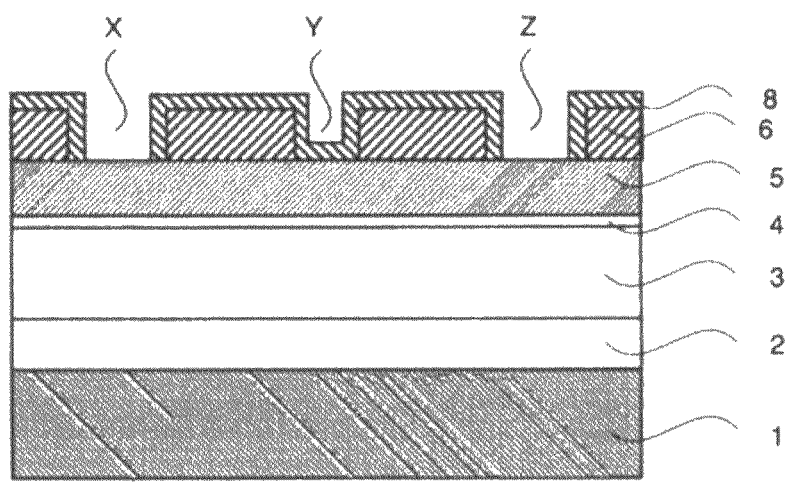
FIG. 8 is a view showing a manufacturing process of the semiconductor device according to the first embodiment.

Next, the photoresist 72 is removed to form the second passivation film 8 as shown in FIG. 8.

Figure 9:
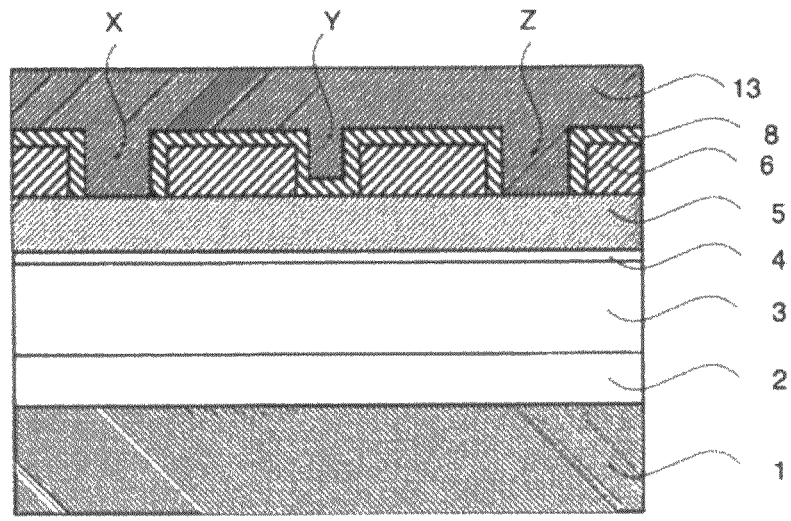
FIG. 9 is a view showing a manufacturing process of the semiconductor device according to the first embodiment.

As shown in FIG. 9, a Ti/Al laminated film 13, i.e., a bilayer with a Ti film and an Al film laminated is formed on the second surface passivation film 8 and the barrier layer 5 exposed through the openings of the second surface passivation film 8. A sputtering system, an electron beam evaporation system or the like can be utilized for the deposition apparatus. Next, a heat treatment is added to make excellent electrical contacts between the barrier layer 5 and the Ti/Al laminated film 13 at the openings X, Z. For example, heating up to 600° C. is added in nitrogen atmosphere using a rapid thermal annealing (RTA) apparatus. The Ti/Al metal laminated film 13 will be patterned to have shapes of the electrodes 14, 15, 16. Here, it is possible to reduce variations in electrical contacts between elements by the heat treatment before the patterning.

Figure 10:
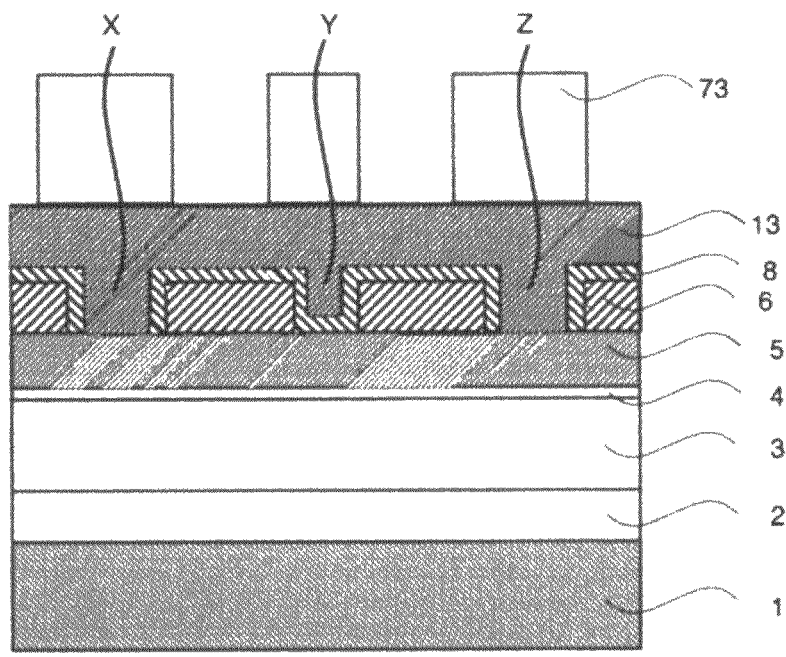
FIG. 10 is a view showing a manufacturing process of the semiconductor device according to the first embodiment.

As shown in FIG. 10, a photoresist 73 having a pattern with portions for the electrodes 14, 15, 16 is formed on the Ti/Al laminated film 13 with a lithography process. The photoresist 73 has a pattern of protruding portions over the openings X, Y, Z of the first surface passivation film 6. The protruding portions have larger sizes than the openings X, Y, Z by about 1 μm. Portions of the Ti/Al metal laminated film in which the pattern of the photoresist 73 is not formed are removed by dry etching by the use of the photoresist 73 as a mask material. Alternatively, a $SiO_2$ film may be formed on the Ti/Al laminated film with a CVD method or the like and a photoresist is applied thereto. The patterning of the photoresist is followed by the etching of the $SiO_2$ film. Then, portions of the Ti/Al metal laminated film in which the pattern of the photoresist 73 is not formed may be removed by etching by the use of the etched $SiO_2$ film as a mask material.

Figure 11:
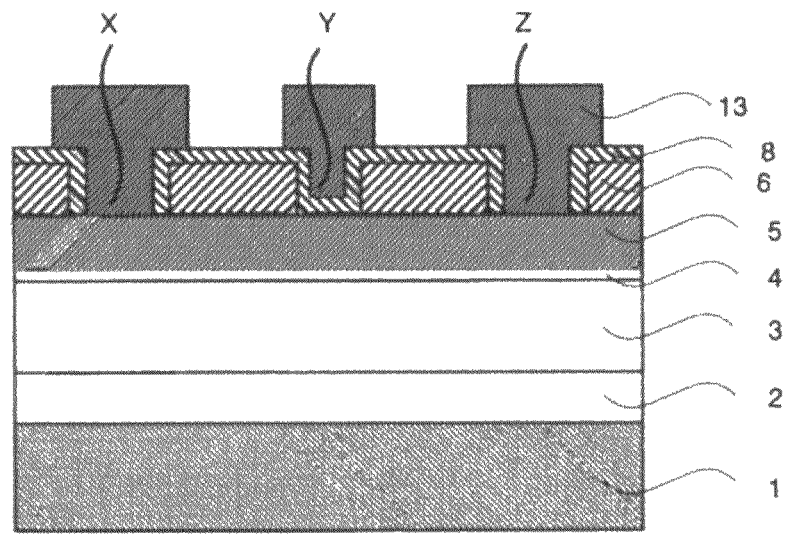
FIG. 11 is a view showing a manufacturing process of the semiconductor device according to the first embodiment.

The photoresist 73 is removed to provide the source electrode 15 including the Ti/Al laminated film, the gate electrode 14 including the Ti/Al laminated film and the drain electrode 16 including the Ti/Al laminated film on the openings X, Y, Z of the first passivation film 6, as shown in FIG. 11.

In this manner, the semiconductor device as shown in FIG. 1 can be formed.

A uniformly prepared metal laminated film is subjected to the heat treatment and is then etched to carve the metal laminated film into the shapes of electrodes, thereby allowing it to form rectangular electrodes in shape simultaneously. The rectangular electrodes have been difficult to form only with an electron beam deposition method and a subsequent heat treatment. However, the embodiment enables it to form the rectangular electrodes and to prevent the side walls of the rectangular electrodes from being roughed, i.e., to prevent deterioration of the properties of the electrodes. Further, the lengths of electrodes and field plates can be designed specifically so that electric field concentration can be relaxed. Accordingly, the embodiment is effective for improving a breakdown voltage and for suppressing current collapse which is a phenomenon of drain current dropping caused by electron trapping occurred in an area where electric fields are concentrated.

Here, the present embodiment has been described using a lateral type high electron mobility transistor having a gate insulator film as a semiconductor device. Alternatively, the present embodiment may use another type of semiconductor device as long as the semiconductor device is a field effect transistor.

Second Embodiment

Figure 12:
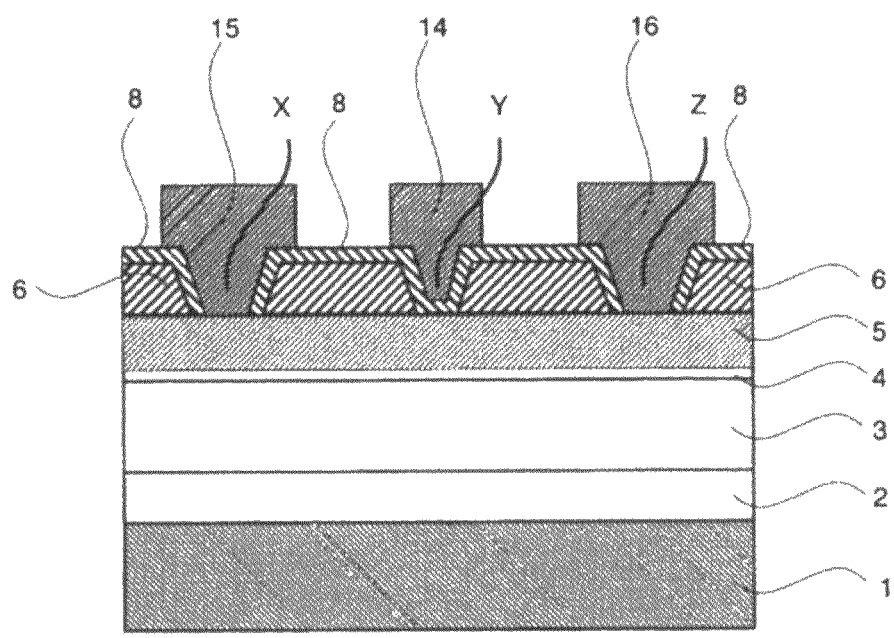
FIG. 12 is a schematic sectional view of a semiconductor device according to a second embodiment.

A semiconductor device according to a second embodiment will be explained with reference to FIG. 12. FIG. 12 is a view showing a section of the semiconductor device.

The side surface of the first surface passivation film 6 is normally-tapered so that the openings narrow toward the barrier layer 5. The other configurations are the same as those in the first embodiment.

As described above, a potential difference is present between the source electrode 15 and the gate electrode 14 and also between the gate electrode 14 and the drain electrode 16. Therefore, there is a possibility that ends of the electrodes 14, 16 receive a load. However, the first surface passivation film 6 is to be normally-tapered to expand toward the barrier layer 5 and can be regarded as having continuous multi-stepped field plates. Accordingly, electric field concentration on the electrodes 14, 16 can be relaxed.

In the manufacturing process of the embodiment, a long etching time is provided to etch the first surface passivation film 6 than that in the first embodiment. The other steps are the same as those in the first embodiment.

The opening of the SiN film is formed to be a normally-tapered shape by controlling the etching conditions for etching the SiN film which is the surface passivation film 6.

Accordingly, coverage is further improved during the preparation of the gate insulator film with an ALD apparatus and an effect to prevent aluminum from diffusing is enhanced. In addition, it becomes possible to provide a field-plate effect to electrode side walls in contact with the gate insulator films buried in the openings. In this manner, characteristics of an MIS-type field effect transistor can be improved.

Third Embodiment

Figure 13:
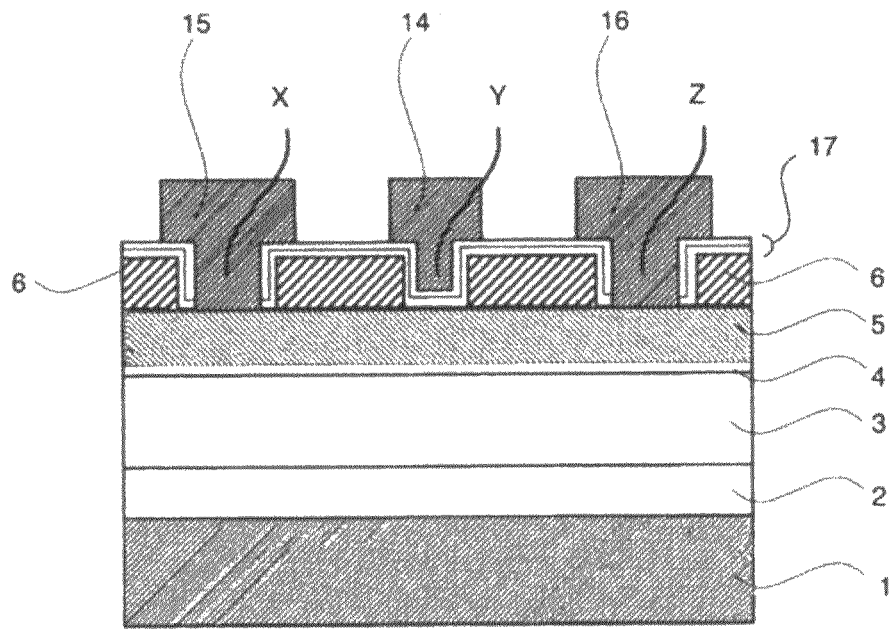
FIG. 13 is a schematic sectional view of a semiconductor device according to a third embodiment.

A third embodiment will be explained with reference to FIG. 13. FIG. 13 is a view showing a section of a semiconductor device.

A second passivation film 17 includes a laminated bilayer. Both two layers included in the bilayer can employ the same material as that of the second surface passivation film in the first embodiment.

When at least one of the two layers of the second passivation film 17 includes a material having a high melting point, the materials of the electrodes 14, 15, 16 are prevented from diffusing to the first surface passivation film 6 as well as in the first embodiment.

For example, when a material having a high melting point is used for both the two layers, an $HfO_2$ film may be used for the lower layer (i.e., on the side of the substrate 1) and an $Al_2O_3$ film may be used for the upper layer. The other configurations are the same as those of the first embodiment and detailed description for the same part will not be repeated.

The $HfO_2$ film includes a material having a higher dielectric constant than the material of the $Al_2O_3$ film, thereby allowing it to thicken the gate insulator film when the two films are combined to use. Accordingly, a leak current can be reduced.

In the manufacturing process of the embodiment, after the first surface passivation film 6 is formed as well as in the first embodiment, two layers are laminated to be the second surface passivation film 17. Subsequently, the portions to form the electrodes 14, 15, 16 are removed by utilizing a photolithography process and an etching process to form the second passivation film 17. Then, the electrodes 14, 15, 16 are formed on the second passivation film 17 as well as in the first embodiment.

Fourth Embodiment

Figure 14:
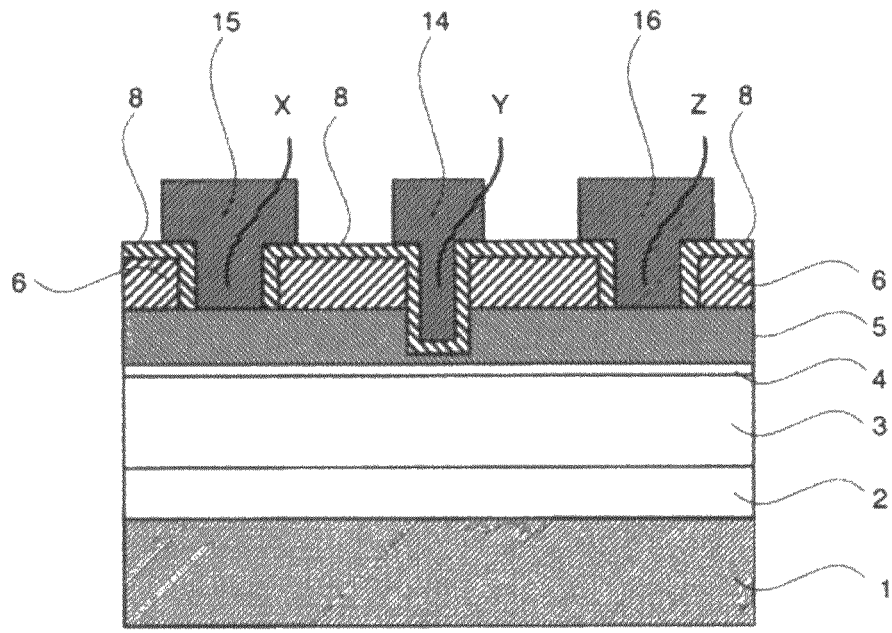
FIG. 14 is a schematic sectional view of a semiconductor device according to a fourth embodiment.

A fourth embodiment will be explained with reference to FIG. 14. FIG. 14 is a view showing a section of a semiconductor device.

A non-through opening Y is formed partially in the barrier layer 5. The second surface passivation film 8 is formed to cover the opening Y. The gate electrode 14 is formed in the non-through opening Y via the second surface passivation film 8. The other configurations are the same as those of the first embodiment and detailed description for the same part will not be repeated.

Providing a gate recess's depth changes a distance between the gate electrode 14 and the channel layer 3. Then, a depletion region extends from the gate electrode 14 to reach a channel so that a gate voltage necessary to interrupt current is varied. Accordingly, a pinch-off voltage can be controlled and an MIS-type field effect transistor of normally-off type can be obtained.

The manufacturing process of the embodiment is the same as the process of the first embodiment stepping forward until forming the first surface passivation film 6. After the SiN film is formed for the first surface passivation film 6, a portion of the barrier layer 5 is continuously etched, which is to be provided with the gate electrode 14 for forming the openings at positions to which electrodes 14, 15, 16 are to be provided. Subsequently, the second surface passivation film 8 and the electrodes 14, 15, 16 are formed as well as in the first embodiment.

In this manner, the present embodiment can also prevent the electrode material from diffusing to the surface passivation film.

Fifth Embodiment

A fifth embodiment will be explained with reference to FIG. 15. In this embodiment, in order to enhance a breakdown voltage causing breakdown of a semiconductor device of this embodiment, the distance between the gate electrode 14 and the drain electrode 16 is made to be longer than the distance between the gate electrode 14 and the source electrode 15. For example, in the semiconductor device requiring a breakdown voltage of 600V, the distance between the gate electrode 14 and the drain electrode 16 is preferably to be 5 μm to 15 μm, and is more preferably to be 10 μm. At the same time, the distance between the gate electrode 14 and the source electrode 15 is preferably to be 2 μm or shorter, and is more preferably to be 1 μm.

Figure 15:
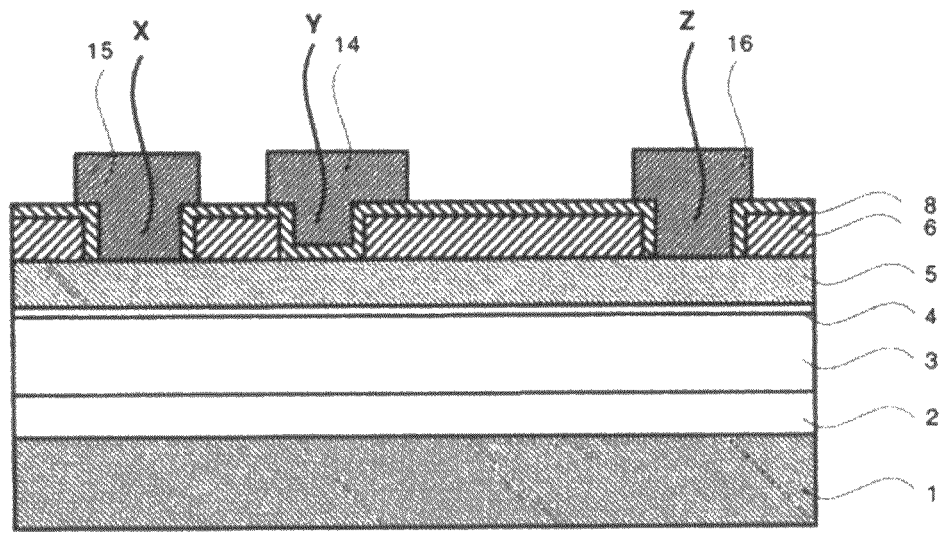
FIG. 15 is a schematic sectional view of a semiconductor device according to a fifth embodiment.

A method of manufacturing the semiconductor device of FIG. 15 is the same as the method in the first embodiment except for the positions to which the openings X, Y, Z and the electrodes 14, 15, 16 are to be provided.

In this manner, the present embodiment can also prevent the electrode material from diffusing to the surface passivation film.

Sixth Embodiment

Figure 16:
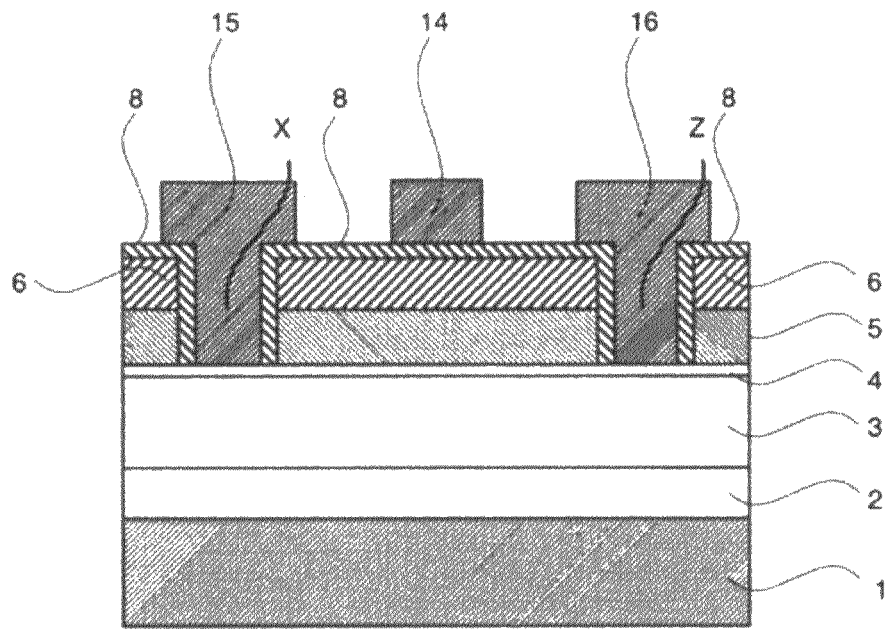
FIG. 16 is a schematic sectional view of a semiconductor device according to a sixth embodiment.

A sixth embodiment will be explained with reference to FIG. 16. FIG. 16 is a view showing a section of a semiconductor device. Openings are formed in the barrier layer 5 so that the openings correspond to the openings X, Z of the first surface passivation film 6 located at the source electrode 15 and the drain electrode 16. The openings of the barrier layer 5 opens down to the spacer layer 4. The side surfaces of the openings X, Z in the barrier layer 5 are covered with the second surface passivation film 8. Here, no opening is formed on the first surface passivation film 6 below the gate electrode 14.

A part of the source electrode 15 and a part of the drain electrode 16 are buried in the openings of the barrier layer 5, thereby enlarging a contact area between the barrier layer 5 and the electrodes 15, 16 to make excellent contacts therebetween.

In the manufacturing process of the embodiment, etching is carried out so that the openings X and Z pass through the barrier layer 5 during forming the openings X, Y, Z, in the first surface passivation layer 6. The source electrode 15 and the drain electrode 16 are to be provided to the openings X and Z. The other steps of the manufacturing process are the same as those in the first embodiment.

In this manner, the present embodiment can also prevent the electrode material from diffusing to the surface passivation film.

Seventh Embodiment

Another method of manufacturing the semiconductor device according to the first embodiment will be explained with reference to FIGS. 17 to 22. The manufacturing steps other than the steps of preparing the electrodes (i.e., FIGS. 2 to 11) are the same as those in the first embodiment and detailed description for the same part will not be repeated.

Figure 17:
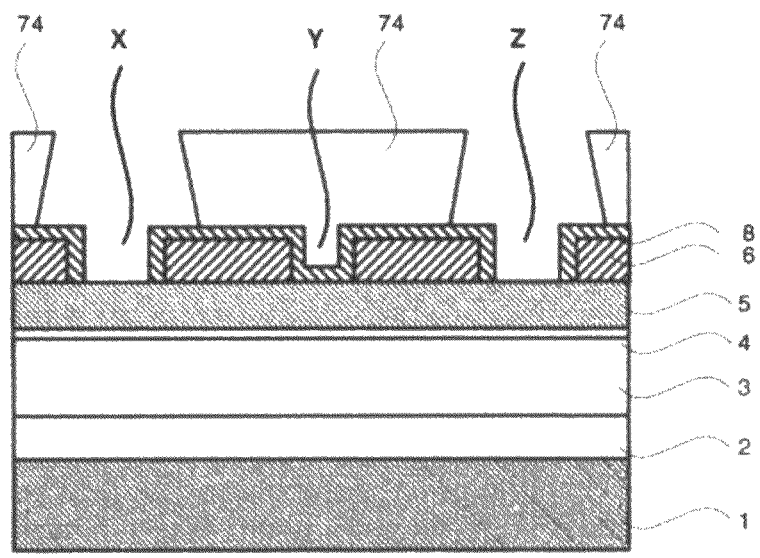
FIG. 17 is a view showing a manufacturing process of the semiconductor device according to a seventh embodiment.

As shown in FIG. 17, after the second passivation film 8 is formed, a photoresist 74 of which end is formed to be reversely-tapered for lift-off is formed on the second passivation film 8 with a lithography process. The photoresist 74 has openings at positions corresponding to the openings X, Z while covering the opening Y.

Figure 18:
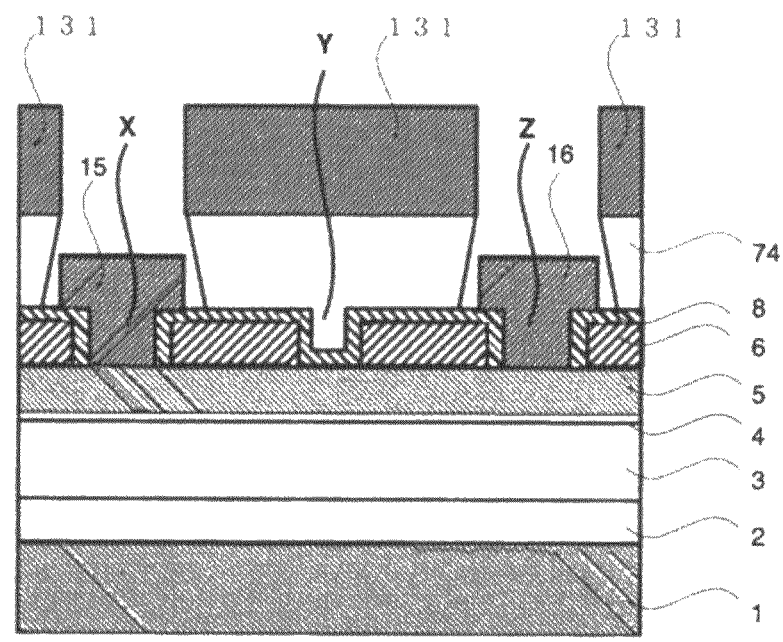
FIG. 18 is a view showing a manufacturing process of the semiconductor device according to the seventh embodiment.

Subsequently, as shown in FIG. 18, a film including a material 131 for the source electrode and the drain electrode is formed on the entire area including the photoresist 74 using a sputtering system, an electron beam deposition system or the like. The material 131 is deposited on the openings X, Z as well as on the upper surface of the photoresist 74. The opening X filled with the film 131 is to be the source electrode 15 and the opening Z filled with the material 131 is to be the drain electrode 16.

Figure 19:
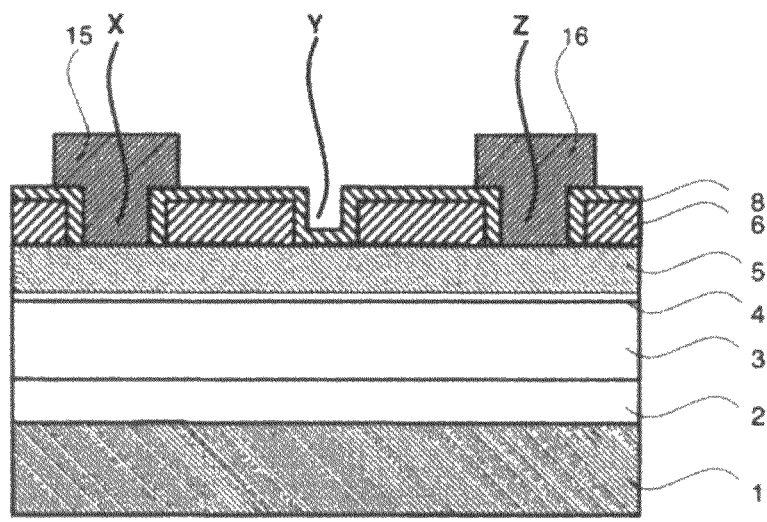
FIG. 19 is a view showing a manufacturing process of the semiconductor device according to the seventh embodiment.

Next, as shown in FIG. 19, the photoresist 74 is removed. At the same time, the electrode material 131 located on the photoresist 74 is also removed.

Figure 20:
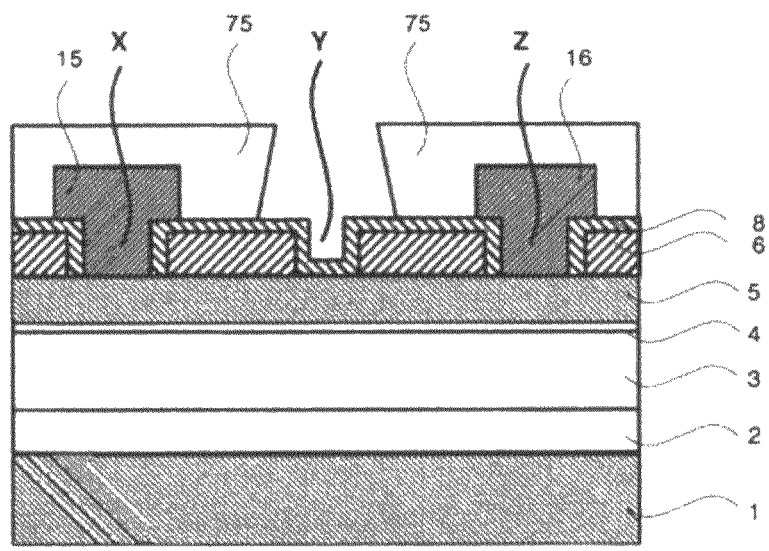
FIG. 20 is a view showing a manufacturing process of the semiconductor device according to the seventh embodiment.
Figure 21:
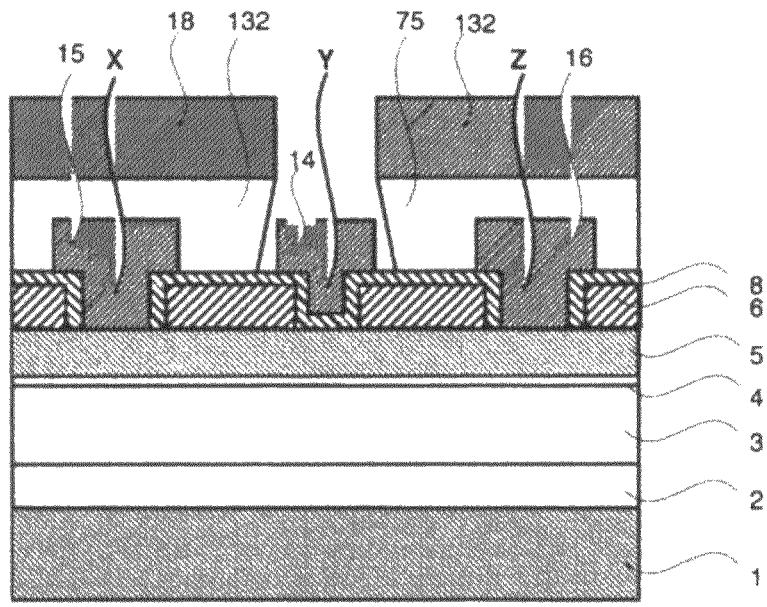
FIG. 21 is a view showing a manufacturing process of the semiconductor device according to the seventh embodiment.

Next, as shown in FIG. 20, a photoresist 75 having an opening at a position corresponding to the opening X is newly formed with a lithography process.

A film including a material 132 for the gate electrode is formed on the entire area including the photoresist 75 using a sputtering system, an electron beam deposition system or the like. The material 132 is also provided to the opening Y as well as to the upper surface of the photoresist 75. The opening Y filled with the electrode material 132 is to be the gate electrode 14.

Figure 22:
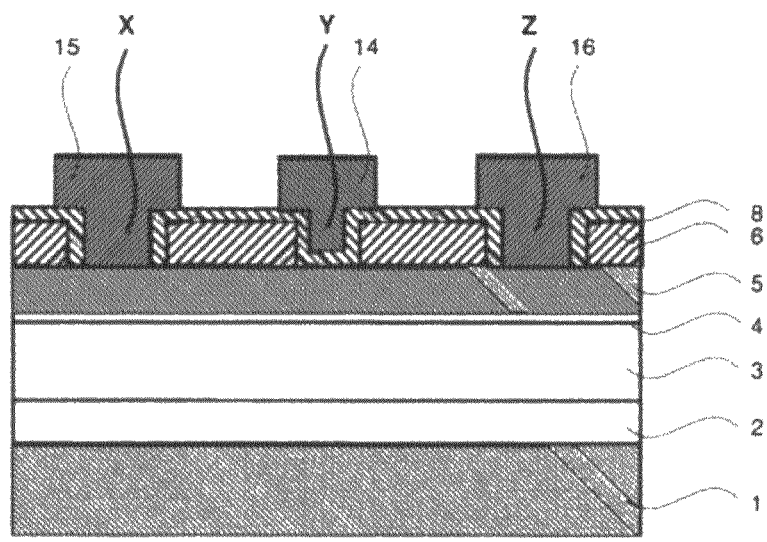
FIG. 22 is a schematic sectional view of the semiconductor device according to the seventh embodiment.

Next, as illustrated in FIG. 22, the photoresist 75 is removed. At the same time, the electrode material 132 located on the photoresist 75 is also removed.

In this manner, the semiconductor device as shown in FIG. 1 can be formed. When the gate electrode 14 is formed separately from the source electrode 15 and the drain electrode 16, the gate electrode 14 can include a material different from the material for both the source electrode 15 and the drain electrode 16.

The present embodiment can also prevent the electrode material from diffusing to the surface passivation film.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A semiconductor device comprising:
a substrate;
a semiconductor layer provided on the substrate;
a first surface passivation film including nitride provided on the semiconductor layer and to have at least two openings;
a second surface passivation film to cover an upper surface and a side surface of the first surface passivation film;
a gate electrode provided on a part of the second surface passivation film; and
a source electrode and a drain electrode respectively provided on the two openings,
wherein
the second surface passivation film includes a material of which melting point is higher than the melting points of the gate electrode, the source electrode, and the drain electrode.

2. The semiconductor device according to claim 1, wherein
the first surface passivation film has an opening; and
the opening is covered with the second surface passivation film and a part of the gate electrode.

3. The semiconductor device according to claim 2, wherein a side surface of the first surface passivation film is normally-tapered in shape.

4. The semiconductor device according to claim 2, wherein the second surface passivation film is formed by laminating two or more films.

5. The semiconductor device according to claim 2, wherein the opening penetrates so that the second surface passivation film and the semiconductor layer are in contact with each other; and
an upper surface of the semiconductor layer corresponding to the opening portion is recessed.

6. The semiconductor device according to claim 2, wherein the semiconductor layer has openings at positions to which the source electrode and the drain electrode are provided.

7. The semiconductor device according to any one of claims 1 to 5, wherein
the gate electrode includes a metal lamination structure same as the source electrode and the drain electrode.

8. A method of manufacturing a semiconductor device, comprising:
forming a first surface passivation film on a semiconductor layer;
forming a first opening, a second opening, and a third opening on the first surface passivation film;
forming a second surface passivation film to cover the first surface passivation film, the semiconductor layer exposed through the openings, and side surfaces of the openings;
opening portions covering the first opening and the second opening of the second surface passivation film with leaving portions covering side surfaces of the openings be covered;
forming a source electrode on the first opening, a drain electrode on the second opening, and a gate electrode on the third electrode on the third opening; and
heat-treating the source electrode, the drain electrode and the gate electrode;
wherein
a material of the second passivation film has a melting point higher than the melting points of the gate electrode, the source electrode, and the drain electrode; and
wherein
the semiconductor device includes:
a substrate;
the semiconductor layer to be provided on the substrate;
the first surface passivation film including nitride to be formed on the semiconductor layer and to have at least two openings;
the second surface passivation film to cover an upper surface and a side surface of the first surface passivation film;
the gate electrode to be provided on a part of the second surface passivation film; and
the source electrode and the drain electrode to be respectively provided on the two openings.

9. The semiconductor device according to claim 1, wherein the whole upper surface and the whole side surface of the first passivation film are covered with the second passivation film.

10. The method according to claim 8, wherein
the whole upper surface and the whole side surface of the first surface passivation film are covered with the second surface passivation film in the forming the second surface passivation film.

* * * * *